Figure 1:
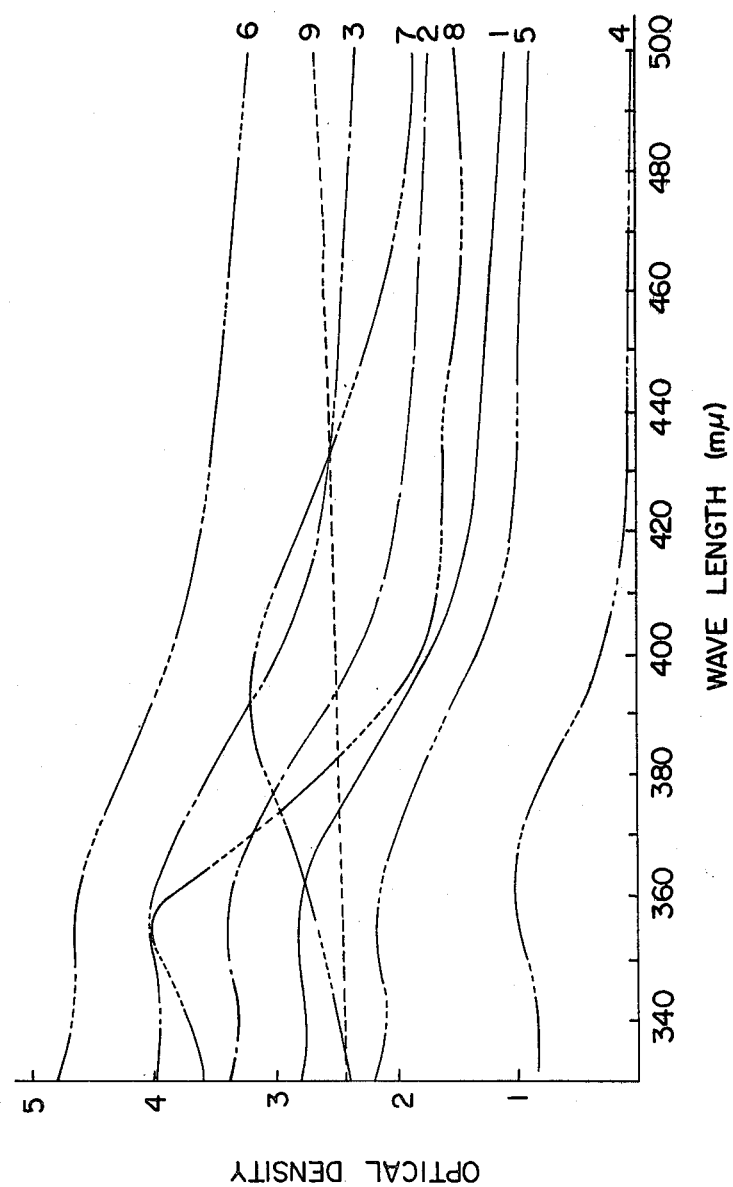

United States Patent [19]

Etoh et al.

[11] 4,419,438

[45] Dec. 6, 1983

[54] IMAGE FORMING MATERIAL AND METHOD

[75] Inventors: Kuniomi Etoh, Shiga; Toshikiyo Tanaka, Toyonaka; Yoshio Katoh, Otsu; Takeo Sugiura, Tokorozawa; Yoshiyasu Itoh, Yono; Takeo Kohira, Chiba, all of Japan

[73] Assignee: Toyo Boseki Kabushiki Kaisha, Osaka, Japan

[21] Appl. No.: 356,410

[22] Filed: Mar. 9, 1982

[30] Foreign Application Priority Data

Mar. 10, 1981 [JP] Japan ................... 56-35008

[51] Int. Cl.$^3$ ................... G03F 7/02; G03C 1/76; G03C 5/00
[52] U.S. Cl. ................... 430/275; 430/272; 430/276; 430/277; 430/278; 430/279; 430/285; 430/300; 430/322; 430/325; 430/916; 430/919; 430/920; 430/923
[58] Field of Search ............... 430/275, 285, 916, 919, 430/920, 923, 272, 276, 277–278, 279, 300, 322, 325

[56] References Cited

U.S. PATENT DOCUMENTS 3,479,185 11/1969 Chambers .................... 430/919

Primary Examiner—Mary F. Downey
Attorney, Agent, or Firm—Armstrong, Nikaido, Marmelstein & Kubovcik

[57] ABSTRACT

An image reproducing material comprising a supporting sheet bearing a metal or metallic compound layer having a thickness of 100 to 1000 Å and a photosensitive resin layer, which is characterized in that said photosensitive resin layer contains (1) an ethylenically unsaturated compound which is polymerizable by the action of free radical and chain propagative, (2) a compound showing photochromism by radical mechanism, (3) a free radical producing agent and (4) an acitinic light absorber. There is also provided an image formed (reproduced) material obtained by patterned exposing the above image reproducing material and then processing the same, a method for obtaining such image formed material and also a method for dot-etching such image formed material. By the use of these materials and methods, dot-etching can be effected easily and there are obtained sharp images without the formation of pin holes.

12 Claims, 1 Drawing Figure

IMAGE FORMING MATERIAL AND METHOD

The present invention concerns a non-silver litho film as an image reproduction material, and, more specifically, relates to an image forming or reproducing material having improved photographic properties as resolving power and being free from the generation of pinholes and capable of being easily subjected to dot-etching to obtain sharp reproduction images.

In the preparation of a printing plate, an original is first camera-worked with a contact screen and separated into halftone dots, simultaneously with the enlargement or reduction in size of the original. Thus the obtained film is contact-exposed and developed with a litho film to make reversed images and the same procedures are repeated several times to obtain the desired images. Finally obtained images are used to expose a printing plate as presensitized plate, offset and letter press printing plate or the like.

As the litho film, use has been made of silver halide type litho film. This, however, has many problems such that it requires special developer and fixer, and when subjected to dot-etching, it may cause decrease in optical density. Therefore, it has long been desired for obtaining a litho film which is developable with a common developer and capable of being easily subjected to dot-etching. Furthermore, abovesaid silver halide type litho film has a visible light sensitivity and therefore, it is necessary to carry out the image reproduction operation in a dark room and thus, the workability and labor environment are not of satisfying level. For these reasons, it has been longed for the image reproduction material which is capable of being processed in a white light. Moreover, silver is an expensive material and therefore, there is a demand of having a non-silver type image reproduction material from the standview of protection of natural resources.

In view of the above, there has been proposed an image reproduction material comprising a supporting sheet bearing a photosensitive resin layer. For example, in Japanese Patent Kokai Nos. Sho 48-65927 and Sho 50-155302, there is disclosed an image reproduction material comprising a supporting sheet having coated thereon, in successive order, a metal layer such as germanium, aluminium or the like, and a photosensitive resin layer. In this type of materials, even if optimum conditions are selected in the formation of metal layer, it is prone to form a number of pinholes, and at the time of conveyance of the supporting sheet coated with said metal layer and subsequent coating of said photosensitive resin layer, there is a tendency to form pinholes and scratches. Therefore, there is a problem that in the printed matters obtained with said image reproduction material, there include a number of inferior portions due to the abovesaid pinholes and scratches. Furthermore, in the abovesaid image reproduction material, the so-called light shielding layer consists of the metal layer alone and therefore, there is a necessity of having a thicker metal layer, which in turn, creates another problems, as compared with the case of thinner metal layer, of requiring higher cost in vacuum deposition of metal layer and longer duration in the etching of said metal layer. Moreover, in such a material, since the photosensitive resin layer scarecely has an actinic light absorption ability, there are problems of optical irregularity and decreasement in resolving power due to the halation from said metal layer. Furthermore, it is very difficult to distinguish one side from the other of the image reproduction material and the image produced is hard to see because of the metallic gloss of the developed film.

Under these circumstances, we, having made an endeavor to solve out many drawbacks possessed by the abovesaid image reproduction material comprising a supporting sheet bearing a metal or metallic compound layer and a transparent photosensitive resin layer, have found that these problems can be solved out in principle by adding an actinic light absorber to the photosensitive resin layer. However, it has also been found that even when the image reproduction material is composed of the photosensitive resin layer containing an actinic light absorber overlayed on the metal or metallic compound layer, if a common photopolymerization initiator such as benzophenone, benzoinethylether or the like is added into the photosensitive resin layer, no image or only indistinct image would be obtained, after development with the material, because of the poor adhesion between the photosensitive resin layer and the metal or metallic compound layer thereof.

We, after continuing studies to overcome the above said problems, have finally succeeded in establishing the present invention. Thus, according to the present invention, improved image reproducing material is provided which comprises a support bearing a metal or metallic compound layer and an outermost photosensitive resin layer, characterized in that the photosensitive resin layer contains (1) ethylenically unsaturated compound which is polymerizable by the action of free radical and chain propagative, (2) a compound having characteristic of photochromism by radical mechanism, (3) free radical producing agent and (4) an actinic light absorbing agent. The invention also provides imaged materials obtained by using the abovesaid image reproducing materials, a process for reproducing images with said image reproducing material and a method for effecting dot-etching of thus obtained images.

Examples of supporting sheet to be used in the present metal type image reproducing materials are films of polyesters, polypropylene, polyethylene, polyvinyl chloride, polyvinylidene chloride, polycarbonate, cellulose acetate and the like. Particularly preferred as the supporting sheet is biaxially oriented polyester film having improved dimensional stability and transparency. The thickness of the supporting sheet is not critical, but, preferable range is from 75 to 125 $\mu$m.

Suitable metals or metallic compounds to be used in the metal or metallic compound layer placed on the supporting sheet are aluminium, polonium, iron, magnesium, silicon, titanium, cobalt, copper, indium, iridium, lead, manganese, molybdenum, nickel, palladium, platinum, rhodium, selenium, silver, tantalum, tin, tungsten, vanadium, zinc, zirconium, and their alloys, oxides, nitrides, borides, carbides, sulfides and salts. Examples of said metal compounds are aluminium oxide, magnesium fluoride, titanium oxide, silicon oxide, aluminium-zinc alloy and the like. Among the abovesaid metals or metallic compounds, most preferable members are aluminium, alloys and compounds thereof because of the lower costs and of higher etching speeds in aqueous solvents. In order to apply on the supporting sheet a thinner layer of said metal or metallic compound, one may use any of the methods of plating, vacuum deposition, sputtering, ionization electrostatic plating and the like. The thickness of the metal or metallic compound layer may be thinner than those of the heretofore known image reproduction material having simple metal layers as the light shielding layers, and, though varying with the kind of metal or metallic compound used, is, in general, in a range from 100 to 1000 Å, and preferably, from 300 to 600 Å.

The photosensitive resin layer of the present invention includes an actinic light absorber, ethylenically unsaturated compound which is polymerizable by the action of free radical and chain propagative, a compound showing photochromism by radical mechanism, and free radical producing agent.

As the actinic light absorber to be incorporated in the photosensitive resin layer, mention is made of inorganic pigments as carbon black, iron oxide, titanium oxide and the like, organic pigments as C.I. pigment black 1 (C.I. 50440) and the like, benzophenone compounds as 2,2',4,4'-tetrahydroxy-4-methoxy-benzophenone, 4-dodecyloxy-2-hydroxybenzophenone and the like, and dyestuffs as Luxol First Black L (C.I. 17), C.I. Dispersed Black (C.I. 11255) and the like. Among them, the most preferable one is carbon black. The amount of said actinic light absorber is, in general, in a range from 4 to 20 weight % based on the weight of photosensitive resin layer, but is preferably determined so as to give the minimum value of optical densities (defined hereinafter) of 1.5 to 3.5. When the actinic light absorber used is not colored, it is preferred to add with coloring matter as Luxol First Blue AR (C.I. 37), Sudan Orange AR (C.I. 12055) or the like for enabling distinguishing both sides of the image reproduction material or to assist easy observation of the developed film. At this time the coloring matter is added, in general, in an amount ranging from 0.3 to 10 weight %.

The optical density of the present image reproducing material, expressed in terms of summation of optical densities of metal or metallic compound layer and that of the photosensitive resin layer, must be at least 2.0, preferably 3.0 and more, when illuminated by actinic light of 350 to 400 nm wave length.

The minimum value of optical densities of the photosensitive resin layer of the present image forming material is, toward the illumination of actinic light of 350 to 400 nm wave length, in general in a range of more than 1.5 and less than 3.5, and preferably from 1.5 to 3.0. If the minimum value of optical densities of said photosensitive resin layer at 350 to 400 nk is less than 1.5, light shielding of the photosensitive resin layer is not sufficient and hence there will be pinholes and cracks in the metal or metallic compound layer, which will cause deterioration of printed matters. Furthermore, if the optical density of the photosensitive resin layer is in a lower order, the exposed area will be excessively hardened, which is hardly dot-etched in the subsequent etching step, and the hardened photosensitive resin will be remained overhunging like umbrella on excessively etched, small size metal or metallic compound dots, thereby resulting inferior dot shape. On the other hand, when the minimum optical density of the photosensitive resin layer exceeds the limit of 3.5, larger amounts of actinic radiations will be absorbed and therefore, a longer time of exposure will be required. Furthermore, fully hardened resist may not be obtained and a number of pinholes will be resulted at the subsequent development and dot-etching steps on this account.

Ethylenically unsaturated compounds which are polymerizable by the action of free radicals and chain propagative and to be added to the photosensitive resin layer of the present invention may include various types of monomers and polymers. As the monomers, mention is made of alkyl acrylates as cyclohexyl acrylate, lauryl acrylate or the like, 2-hydroxyalkyl acrylate as 2-hydroxyethyl acrylate or the like, aminoalkyl acrylates as N,N-dimethylaminoethyl acrylate or the like, ether alkyl acrylates as 2-methoxyethyl acrylate or the like, glycidyl acrylate, halogenoalkyl acrylate and polyfunctional acrylates as trimethylol propane triacrylate, trimethylol propane trimethacrylate, triethylene glycol dimethacrylate or the like. As the polymers, preference is given to such members as having ethylenically unsaturated groups in the side-chains thereof. Examples of such members are β-cinnamoyloxyethyl methacrylate-methacrylic acid copolymer, addition product of methyl methacrylate-methacrylic acid copolymer and glycidyl methacrylate, partial ester of β-vinyloxyethyl cinnamate-maleic anhydride copolymer, partial ester of styrene-maleic anhydride copolymer with aryl alcohol and the like. When the abovesaid ethylenically unsaturated compound which is polymerizable by the action of free radical and chain propagative, are monomers, it is necessary to use soluble high molecular binder together with the same. As the soluble high molecular binder, one may use various types of solvent soluble polymers, but particularly preferable members are the following water soluble polymers from the standview of operational easiness and safetyness. First group is a polymer containing carboxyl groups. Typical examples are methyl methacrylate-methacrylic acid copolymer, methyl methacrylate-acrylic acid-methyl acrylate copolymer, styrene-methacrylic acid copolymer, partial ester of styrene-maleic anhydride copolymer and phthalic acid-cellulose acetate. Second group is a polymer containing phenol groups, as Novolak type phenol resin-poly-p-biphenol and the like, and third group is a polyester or a polyamide containing sulfonic acid groups. The image reproducing materials containing the abovesaid soluble high molecular binders may be developed by alkaline aqueous solutions and washed with water to fix the same. As an additional group of soluble high molecular binder, mentioned is made of high molecular substance containing basic nitrogen capable of being converted to quaternary group, as, for example, 2-methyl-2-(N,N-dimethylamino)methyl-1,3-propanediol-terephthalic acid copolymer, bis-aminopropyl piperazine-adipic acid-caprolactum copolymer and the like. The image forming or reproducing material containing the above may be developed with acidic aqueous solution and washed with water to fix the same. The amount of said soluble high molecular binder may be, in general, 20 to 80 weight % based on the weight of photosensitive resin layer.

In the present invention, the amount of ethylenically unsaturated compound which is polymerizable by the action of free radical and chain propagative is preferably selected within a range 10–45 weight % based on the weight of photosensitive resin layer.

In the present invention, the term "a compound showing photochromism by radical mechanism" means the compound which will easily dissociate, by the action of actinic light, into radicals and come back to the original stable compound when kept in a dark place. Examples of such compounds are bis(tetraphenylpyrolyl)-2,3,4,4-tetrachloro-1,4-dihydronaphthalene-1-one, tetraphenylhydrazine, triarylimidazole dimer and the like. Among them, triarylimidazole dimer is the most preferable one because of the higher sensitivity in the image reproduction material. Typical examples of such triaryl imidazole dimers are triphenylimidazole dimers as 2-(o-methoxyphenyl)-4,5-diphenylimidazole dimer, 2-(o-chlorophenyl)-4,5-diphenylimidazole dimer, 2-(p-methylmercaptophenyl)-4,5-diphenylimidazole dimer or the like, and polycyclic aryl-4,5-diphenylimidazole dimers as 2-(1-naphthyl)-4,5-diphenylimidazole dimer, 2-(9-anthryl)-4,5-diphenylimidazole dimer, 2-(pyrenyl)-4,5-diphenylimidazole dimer, 2-(2-methoxy-1-naphthyl)-4,5-diphenylimidazole dimer, 2-(2-chloro-1-naphthyl)-4,5-diphenylimidazole dimer, 2-(2-chloro-1-naphthyl)-4,5-di(m-methoxyphenyl)-imidazole dimer, 2-(2-bromo-1-naphthyl)-4,5-diphenylimidazole dimer, 2-(2,4-dimethoxy-1-naphthyl)-4,5-diphenylimidazole dimer, 2-(2,4-dichloro-1-naphthyl)-4,5-diphenylimidazole dimer, 2-(1-naphthyl)-4,5-di(p-chlorophenyl)-imidazole dimer, 2-(1-naphthyl)-4,5-di(p-methoxyphenyl)-imidazole dimer and the like. The amount of said compound showing photochromism by radical mechanism is usually 1 to 15 weight % based on the weight of photosensitive resin layer.

Free radical producing agents to be incorporated into the present photosensitive resin layer are the compounds capable of reacting, at the time of exposure to actinic radiation, with dissociated radicals coming from the abovesaid compound showing photochromism by radical mechanism, to give active initiation radicals and starting polymerization of chain propagative, ethylenically unsaturated compounds with said free radicals. Various compounds may be used as free radical producing agents, and particular mention is given to p-aminophenyl ketone compounds as p,p'-bis(dimethylamino)benzophenone or the like, Leucotriphenylmethane dyes as Leuco Malachite Green, Leuco cystal violet or the like, cyclic diketones as 2,4-diethyl-1,3-cyclobutanedione or the like, thioketones as 4,4'-bis(dimethylamino)thiobenzophenone or the like, mercaptan compounds as 2-mercaptobenzothiazole or the like, N-phenylglycine, dimedone and 7-diethylamino-4-methyl coumarin. These free radical producing agents are used in various combinations with the above mentioned compounds showing photochromism by radical mechanism, and particular combination is selected, in practice, depending on the properties as sensitivity of the image reproducing material and time-stabilities of said properties. The free radical producing agents are usually added in a concentration of 1–15 weight % based on the weight of photosensitive resin layer.

Additionally, the present photosensitive resin layer may preferably include heat stabilizer as, for example, hydroquinone monomethyl ether, phenothiazine and the like. The amount of said stabilizer is in general 0.01 to 5 weight % based on the weight of photosensitive resin layer.

To further assist good bonding between the photosensitive resin layer having the abovesaid composition and the metal or metallic compound layer, an adhesive layer may be formed on said metal or metallic compound layer. As the adhesive layer, mention is made of thin layer of a polymer such as ethylacrylate-methacrylic acid copolymer, n-butyl methacrylate-methacrylic acid-2-ethylhexyl acrylate copolymer and vinylidene chloride-methylacrylate-itaconic acid copolymer. The thickness of said adhesive layer is, in general, in a range of 0.2 to 2 μm.

The photosensitive resin layer may be formed by applying on the surface of polyester film bearing metal or metallic compound layer a photosensitive resin composition containing solvent as alcohols, ketones, esters or halogenated hydrocarbons, and abovesaid components, and heating thus obtained material to evaporate the solvent therefrom. The thickness of the photosensitive resin layer is selected so as to give the desired optical density, usually in a range of 1 to 6 μm. Too thicker coating is not recommended because of the possible decrease in the resolving power of the material obtained.

The photosensitive resin layer may be coated with a removable cover film having a good optical transmission or a protecting layer being soluble in aqueous solvent. Examples of materials which are soluble in aqueous solvents are polyvinylalcohol, polyacrylic acid, phthalic acid-cellulose acetate and the like. Among them, the most preferable one is polyvinyl alcohol because it has an excellent oxygen barrier property and can reduce the effect of oxygen of inhibiting the radical polymerization. The thickness of the protecting layer is preferably selected in a range of 1 to 2 μm from the standview of having no effect on the resolving power.

As a light source to be used in the exposure of the present image reproducing material, any of the light sources capable of hardening the photosensitive resin layer may be satisfactorily used, including various mercury lamps, carbon arc lamps, metal halide lamps, xenone lamps and the like.

On the photosensitive resin layer (or protecting layer) of the present image reproducing material, is put a halftone negative or halftone positive film, and the stack is exposed with an actinic radiation, thereby hardening the exposed photosensitive resin layer alone. After removing the protecting layer, if existed, (in the case of cover film, after separating the same), the development is carried out by treating the material with an organic solvent, acidic aqueous solution or alkaline aqueous solution, depending on the type of photosensitive resin layer, to remove the unexposed areas therefrom.

Then, the treated material is subjected to etching with an alkaline aqueous solution or acidic aqueous solution, depending on the type of metal or metallic compound layer involved, to complete development thereof. Although two-step type development can be carried out, first step being for the development of photosensitive resin layer and second step being for the development of metal or metallic compound layer, one-step type development may also be satisfactorily used with the single solvent for both photosensitive resin layer and metal or metallic compound layer, if desired.

When the metal or metallic compound layer involved is of alkali solution soluble type, one-step type development with an aqueous alkaline solution will cause such problem that after completion of dissolution of photosensitive resin layer and while etching the underlying metal or metallic compound layer, the developer will attack the hardened portion of said resin layer and the size of said photosensitive resin will become much smaller than that of the corresponding portion of the metal or metallic compound layer, thereby resulting images with ununiform optical densities. Therefore, under the circumstances, it is preferred to use separate development steps, the first development being for the photosensitive resin layer and the second development being for the metal or metallic compound layer with an aqueous solution containing an alkaline earth metal. However, even in the one-step type development, if the aqueous alkaline solution is added with iron ions and/or copper ions, the required development time will be greatly reduced and hence the abovesaid problem will be advantageously overcome.

The first and the second developers used in the two-step type development shall be explained more fully hereinunder.

As the first developer for the photosensitive resin layer, is used an aqueous solution of hydroxide or carbonate of an alkali metal as lithium, sodium, potassium, rubidium, cesium or the like. Particularly preferred are aqueous solutions of sodium hydroxide, sodium carbonate, potassium hydroxide and potassium carbonate. PH of said developer is settled by the kind and composition of photosensitive resin layer and development speed, but is usually in a range of 9 to 14, preferably 11 to 13.5. The first developer may include alkaline inorganic salts such as tribasic sodium phosphate, tribasic potassium phosphate, sodium aluminate and the like, and oxiding agents as sodium chlorite, potassium bromate, sodium iodate and the like. If desired, the said developer may include for the purpose of retarding development speed, hydroxides or carbonates of alkaline earth metals. The amounts of said alkaline earth metal compounds are less than equimolar amounts, preferably less than 10 mol %, based on the abovesaid alkali metal compounds, and too larger quantity should be avoided because of failure in effecting development of said photosensitive resin layer. In this first development step, a bath temperature of 10° to 50° C. and a treating time of 1 to 30 seconds may successfully be used. Too severe conditions will result in reduction in size or partial disappearance of dots, thereby causing decrease in resolving power and deterioration of halftone dots reproducibility.

In this first development, the following may be used together with an aqueous alkali metal solution: alcohols such as methyl alcohol, ethyl alcohol, isopropyl alcohol and the like, ketones such as methylethylketone, acetone, diethyl ketone and the like, esters such as ethyl acetate, butyl acetate, amyl acetate and the like, halogenated hydrocarbons such as trichloroethane, ethylenechloride, tetrachloroethane and the like, and ethers such as tetrahydrofuran, dioxane and the like.

After finishing the first development of photosensitive resin layer, the image reproducing material is washed with water to remove the first developer, and than subjected to the second development. As the second developer for metal or metallic compound layer, mention is made of aqueous solutions of hydroxides of alkaline earth metals. PH of the second developer is settled by the kind of metal or metallic compound layer, etched dots shape and development speed. However, it is usually selected within a range from 10 to 14, preferably 11 to 14. To the second developer, inorganic salts of alkaline earth metals such as calcium aluminate, oxidizing agents such as calcium chlorite and magnesium iodate, or salts of iron, aluminum, copper and other metals may be added. If desired, hydroxides or carbonates of alkali metals can be added for the purpose of increasing the development speed of the metal or metallic compound layer. The amount of said alkali metal compounds should be equivalent to or less than the amount of said alkaline earth metal compounds, preferably less than 10 mol %, since too excessive amounts will cause the erosion of photosensitive resin layer. The second development of said metal or metallic compound may be carried out at 20° to 70° C., preferably 30° to 40° C., for 0.5 to 10 minutes, preferably 1 to 3 minutes. Somewhat excessive conditions may be tolerable, but insufficient treating conditions will cause fringe at a fine line portion.

In the one step type development method, when an alkaline aqueous solution containing iron ions and/or copper ions is used for the purpose of shortening the development speed required, said iron ions and/or copper ions can work, regardless of the valencies thereof, well for the intended object. Examples of the compounds to be added to the developer are anhydrides or hydrates of ferrous chloride, ferrous chloride, ferric phosphate, ferric oxalate, cuprous chloride, cupric chloride, and ferrous oxide and the like, and however, preferably members are chlorides having good solubilities. As to the concentrations of iron ions and/or copper ions in the developer, too lower level cannot be recommended because of the insufficient effect for shortening the development time, and therefore, the lower limit should preferably be determined at 1 ppm or more, preferably at 5 ppm or more. On the other hand, a larger quantity of said compound may cause precipitation in the developer and prolong the development time, and therefore, the upper limit should be 600 ppm or less, preferably 400 ppm or less.

As the alkaline aqueous solution containing iron ions and/or copper ions to be used in the abovesaid one-step type development, one may use the solution obtained by adding iron ions and/or copper ions to the first developer mentioned in connection with the abovesaid two-step type development. Even in the two-step type development system, these iron and/or copper ions may likewise be added to the second developer used for the treatment of metal or metallic compound layer.

In each developer for the photosensitive resin layer and the metal or metallic compound layer, organic solvents and surfactants may be present for aiding easy contact with the respective layer treated. Examples of such organic solvents are alcohols such as methyl alcohol, ethyl alcohol, benzyl alcohol, ethyleneglycol, methylcellosolve, ethylcellosolve, and the like, amines as monomethylamine, dimethylamine, trimethylamine, monoethylamine, diethylamine, triethylamine, monoethanolamine, diethanolamine, triethanol amine and the like, and ketones such as acetone, methylethylketone and the like. The amount of these organic solvents are less than 15 weight % based on the weight of developer, preferably less than 5 weight %. Examples of surfactants are ionic and nonionic materials widely on the market, including Noigen EA 140 (Daiichi Kogyo Yakuhin K.K.), Labelin FH (Daiichi Kogyo Yakuhin K.K.), Fluorad-FC (Sumitomo Three-M) and the like, and the amount is, in general, less than 5 weight % based on the weight of developer, preferably less than 2 weight %.

The present image reproducing materials can be, if desired, dot-etched after development, and are very useful for tone correction in color printing because there are no decrease in optical density and scarcely generation of pinholes as is the case with silver halide films. Dot-etching may be carried out by dipping whole or a part of half-tone dots film into the same solvent as used in the developer or diluted or concentrated solvent, and washing the same.

In the case wherein the metal or metallic compound layer of the present image reproducing material is of the alkaline aqueous solution soluble type, if the dot-etching is carried out with a single alkaline aqueous solution, there are fears of the same type as already stated in connection with the development thereof. Therefore, it is preferred to use two-step separate dot-etching operations, first being for the dot-etching of the photosensitive resin layer and second being for the metal or metallic compound layer with an aqueous solution containing alkaline eartch metal. However, as stated in connection with development step, if iron ions and/or copper ions are added to the alkaline aqueous solution, the dot-etching time is greatly reduced and hence, even with a single aqueous alkali solution, there would be no problems as abovementioned.

Since the photosensitive resin layer provided on the metal or metallic compound layer contains actinic light absorber, the present image reproducing materials have the following advantages: First of all, since the possible pinholes in the metal or metallic compound layer can be controlled by the provision of the present photosensitive resin layer, qualities of the finally formed, printed matters can be improved. Secondly, since the actinic light absorber can protect the halation from the metal or metallic compound layer, the reproduced images are of good resolving power. Since the photosensitive resin layer also has the light shielding property, it is possible to use a thinner metal or metallic compound layer, which will contribute to the reduction in the processing cost for making the metal or metallic compound layer and shortening the etching time required. During the dot-etching, since the photosensitive resin layer is dissolved from the side directions, the dot-etching time is greatly reduced. Furthermore, there are no insufficient dot-etching or no formation of bad-shaped half-tone dots having umbrella-like hardened photosensitive resin remained overhung on the metal or metallic compound layer. Since the present image reproducing material has the back of metallic color tone and the surface colored by the photosensitive resin layer, it is very easy to distinguish both sides of the film, and to look at the developed images. Furthermore, as to the question of decrease in adhesive power between the metal or metallic compound layer and the photosensitive resin layer which is resulted from the addition of acetinic light absorber in the photosensitive resin layer, this has been solved out by the addition to the resin layer a compound showing photochromism by radical mechanism. Thus, the adhesion between the metal or metallic compound layer and the photosensitive resin layer has been improved, the occurence of image separation during or after development has been solved out and sharp images can be obtained. Therefore, the present image reproducing materials are useful, besides the abovementioned litho film, in various purposes as, for example, printed circuit board manufacturing material, indicator board manufacturing material and the like.

The invention will be further illustrated by the following examples and comparative examples, wherein parts are by weight and optical density is measured by using self-recording spectrophotometer (Hitachi Seisakusho, Type 320) and shown as minimum optical density at 350 to 400 nm. The optical density of photosensitive resin layer is measured by using the film prepared by coating on polyester film previously covered by adhesive layer, but not applied with metal or metallic compound layer, the said photosensitive resin composition.

FIG. 1 is a graph showing optical densities of various photosensitive resin layers at 330-500 nm.

EXAMPLE 1

A surface of 100 μm thick biaxially oriented polyethylene terephthalate film was washed and dried, and then was vacuum metallized with aluminum (500 Å thickness) under vacuum of $10^{-5}$ Torr by using vacuum metallizer of electric resistance heating system. In this aluminum deposited polyester film, considerable number of pinholes having diameters 20 to 50 μm were found in the aluminium layer. The optical density of this aluminium layer was, as shown in FIG. 1, curve line 9, 2.5 at 400 nm.

Then, the photosensitive resin solutions having the compositions shown in Table 1 were prepared and each solution was coated, by using reverse coater, in 3 μm thickness, on the abovesaid aluminium deposited polyester film, respectively.

TABLE 1

| Composition (parts) | Sample material 1 | Sample material 2 | Sample material 3 |
|---|---|---|---|
| polymer* | 49 | 47 | 45 |
| carbon black | 4 | 6 | 8 |
| trimethylolpropane triacrylate | 36 | 36 | 36 |
| 2-(2-methoxy-1-naphthyl)-4,5-diphenylimidazole dimer | 8 | 8 | 8 |
| 2-mercaptobenzoimidazole | 3 | 3 | 3 |
| hydroquinone monomethylether | 0.032 | 0.032 | 0.032 |
| surfactant** | 0.48 | 0.48 | 0.48 |
| 1,3,5-triphenyl pyrazoline | 3 | 3 | 3 |
| methanol | 414 | 414 | 414 |
| minimum value of optical density of photosensitive resin layer at 350–400 nm | 1.7 | 2.3 | 2.9 |

*methylmethacrylate-methacrylic acid-2-ethylhexylacrylate copolymer (45:25:30 mol %) (acid value 115)
**Fluorad FC-430 (Sumitomo Three-M)

Onto the photosensitive resin layer, was applied by a reverse coater the following composition to obtain the respective photosensitive film (Sample materials 1-3) having a 2 μm thick protecting layer.

| | |
|---|---|
| Polyvinylalcohol No. 105 (Kuray K.K.) | 70 parts |
| Neugen EA 140 (Daiichi Kogyo Seiyaku K.K.) | 3 parts |
| ethyleneglycol monobutylether | 7 parts |
| water | 920 parts |

In FIG. 1, curved lines 1-3 are absorption spectrums of the photosensitive resin layers corresponding to those of the image forming materials (Sample material) 1-3, respectively. The minimum values of optical densities at 350 to 400 nm resided at 400 nm and the optical densities at 400 nm of Sample materials 1-3 were 1.7, 2.3 and 2.9, respectively.

Then, the image reproducing materials 1-3 were, using 21 stepped guide and test negative film comprising 5–95% screen dots (150 lines/inch), fine lines, letters and independent dots, exposed for 8, 10 and 12 seconds to extra-high pressure mercury lamp (3 Kw, 70 cm), washed with water, immersed in the first developer (30° C.) comprising sodium hydroxide 2 g, sodium chlorite 3 g, tribasic sodium phosphate 5 g, surfactant 0.1 g and water 1 liter, for 11, 9 and 7 seconds, and washed again to remove unexposed portions of the photosensitive resin layers. After said first developments, the materials were immersed in the second developer (38° C.) comprising calcium hydroxide 1.5 g, aluminium chloride 0.1 g, Neugen EA-140 (Daiichi Kogyo Seiyaku K.K.) 2 g, triethanolamine 1 g, ferric chloride 0.7 g and water 1 liter, to effect etching of the unexposed area of the aluminium layers for each 51 seconds and washed with water. Thus obtained image reproducing material showed no pinholes in the solid portions and no decrease in optical density. Furthermore, since the photosensitive resin layer was black in color, observation of images was very easy as compared with the cases of heretofore known materials having transparent photosensitive resin layers.

Then, the developed sample materials 1-3 were immersed into the abovesaid first developer for 28 seconds, immersed into the second developer for 49 seconds and washed with water. By these treatments, it was found that screen dots were etched in average, 12, 13 and 14%, respectively, in 40 to 70% areas, no generation of pinholes in solid portions and no decrease in optical densities were observed, and no deterioration of screen dots due to the remaining of overhund like umbrella hardened photosensitive resin on the metal layer was found out.

In the next series of tests, the image reproducing materials (sample materials) 1-3 were exposed through test positive film comprising 5-95% half-tone dots (150 lines/inch), fine lines and letters, and developed as stated above. At that time, no generation of pinholes was observed and there was no necessity for opaque. Using thus developed films, negative type presensitized Plates SGN-II (Fuji Photo-Film Co.) were exposed, developed and then gummed up. Thus obtained presensitized Plates were used in Ryobi KR-480 Offset Printing Machine (Ryobi Seisakusho) for printing, and the printed matters were found to be of very high qualities, reproducing original screen dots, fine lines and letters quite well and showing no inferior portions therein. Sample materials 4-6 were prepared as follows:

Using the same components and same compounding ratio as stated in regard to Sample material 1, solutions of photosensitive resin compositions were prepared, excepting changing the compounding ratio of polymer:-carbon black to 53:0, 51:2 and 42:11, respectively. Thus obtained solutions were applied by using a reverse coater onto the same aluminium deposited polyester film as used in Sample material 1, in 3 μm thickness, and then the protecting layer was coated in 2 μm thickness in the same way. Absorption sectrum of the photosensitive resin layers corresponding to those of Sample materials 4-6 were shown in FIG. 1, as curved lines 4-6. The minimum values of optical densities at 350 to 400 nm resided at 400 nm, and the respective optical density at 400 nm of Sample materials 4-6 were 0.3, 1.3 and 3.9.

Next, the image reproducing materials (Sample materials) 4-6 were exposed for 3, 6 and 20 seconds, immersed into the first developer for 14, 12 and 5 seconds, washed with water, immersed into the second developer for each 51 seconds, and washed with water again, as in the case of Sample material 1.

In the image reproducing material 6, optical density of the photosensitive resin layer was somewhat higher than those of the others, and therefore, a longer time exposure was required. The developed film showed fairly number of pinholes and a slight decrease in optical density.

In the case of Sample material 4, it was very difficult to see the images of the developed film because of the transparency of the photosensitive resin layer and due to the reflected light from the aluminium layer. Furthermore, when examined dot-etching effect by dipping the developed material into the first developer for 29 seconds and then into the second developer for 49 seconds according to the procedures as stated in regard to Sample material 1, it was found that the dot-etching was only effected to 2%, and the hardened photosensitive resin layer was remained like umbrella on the metal layer, thereby resulting inferior shaped half-tone dots. The image reproducing material 5 could be dot-etched up to 5%, but it was not of fully satisfaction. In the image reproducing material 6, the screen dots were somewhat disordered in shape.

EXAMPLE 2

Using the same aluminium deposited polyester film as stated in Example 1, the photosensitive resin solution having the following composition was coated in 3 μm thickness on said film, by means of reverse coater.

| | |
|---|---|
| polymer (same with that of Example 1) | 40 parts |
| ferric oxide | 13 parts |
| trimethylol propane triacrylate | 36 parts |
| 2-(o-chlorophenyl)-4,5-bis(m-methoxyphenyl)imidazole dimer | 8 parts |
| Dimedone | 3 parts |
| hydroquinone monomethylether | 0.032 part |
| surfactant (Fluorad FC-430, Sumitomo Three-M) | 0.48 part |
| 7-(3,5-diphenylpyrazoline)-4-methyl coumarin | 3 parts |
| acetone | 200 parts |
| methanol | 214 parts |

Onto the abovesaid film, was coated a 2 μm thick protecting layer as in Example 1 to obtain the image reproducing material of this Example. The absorption spectrum of the photosensitive resin layer in this image reproducing material was shown in FIG. 1, as curved line 7. The minimum value of optical densities at 350 to 400 nm was 2.6 at 350 nm.

Thus obtained image reproducing material was, according to the procedures as stated in Example 1, exposed for 13 seconds, immersed in a developer (38° C.) comprising sodium hydroxide 2 g, sodium chlorite 3 g, tribasic sodium phosphate 5 g, surfactant 0.1 g, cupric chloride 0.7 g and water 1 liter, for 22 seconds, and washed with water. Using thus developed half-tone positive film, another sheet of image reproducing material of this Example was exposed and developed to obtain a half-tone negative film. When examined reproduction of screen dots (150 lines/inch) for each of the negative film, half-tone positive film and subsequently contact-exposed and developed, reversed half-tone negative film, it was found that dot size reproduction was very good, within ±2% deviation, in the 5-95% region of the tone range.

When the developed film was treated with a liquid having the same composition with that of the above-mentioned developer, it was found that 13% dot-etching was obtained, without generating pinholes and while keeping excellent dot shape.

Next, the image reproducing material was, according to the procedures as stated in Example 1, exposed through test positive film and developed. No pinholes were found in the developed film. Using said developed film, a photosensitive resin plate (Toyobo Printite, Toyo Boseki K.K.) was exposed to chemical lamp for 6 minutes, washed with water and dried for 2.5 minutes, and exposed to light for 3 minutes. Thus obtained resin plate was set in a letter press automatic printing machine SA 3D (Shimizu Seisakusho) and used in printing according to the usual procedures. Thus obtained printed matters showed good qualities in terms of halftone dots and fine lines reproduction.

EXAMPLE 3

Onto the same aluminium deposited polyester film as stated in Example 1, was coated in 3 μm thickness by reverse coater a photosensitive resin solution having the following composition, which was characterized by containing an actinic light absorber hereinunder stated in place of carbon black.

| | |
|---|---|
| n-butyl methacrylate-methacrylic acid-n-butyl acrylate copolymer (45:25:30 mol %) (acid value 115) | 43 parts |
| 2,2',4,4'-tetrahydroxy-benzophenone | 8 parts |
| Luxol First Black L (C.I.N. 17) | 8 parts |
| trimethylolpropane tri-methacrylate | 30 parts |
| 2-(2-chloro-1-naphthyl)-4,5-diphenyl imidazole dimer | 8 parts |
| 2-mercaptobenzoxazole | 3 parts |
| Eosine Y | 0.3 part |
| hydroquinone monomethylether | 0.032 part |
| methanol | 401 parts |

On the abovesaid photosensitive resin layer, was applied in 2 μm thickness a protecting layer as in Example 1, to obtain an image reproducing material. Absorption spectrum of said photosensitive resin layer in the image reproducing material of this Example is shown in FIG. 1, as curved line 8. The minimum value of optical densities over 350–400 nm was 1.8 at 400 nm. This image reproducing material was exposed for 14 seconds, immersed in the first developer for 5 seconds, immersed in the second developer for 51 seconds, and washed with water as in Example 1. There was no pinholes in the developed film. When the developed film was subjected to dot-etching as in Example 1, 14% dot-etching was obtained, showing no decrease in optical density and no generation of pinholes. Thus dot-etched film was contact-developed with the image forming material of this Example to reverse images, and the dot-etching effect was examined. In the contact-exposed and developed film, was observed full effect of said dot-etching and excellent screen dot shape.

COMPARATIVE EXAMPLE 1

A photosensitive resin solution having the same composition with wat of Sample material 2 in Example 1 was prepared, excepting substituting following initiator for 2-(2-methoxy-1-naphthyl)-4,5-diphenyl imidazole dimer, and image forming material was prepared as in Example 1. As the initiator, was used benzoinethylether for the image reproducing material No. 7 and a combination of benzophenone and Michler's ketone (5:1 molar ratio) for the image reproducing material No. 8. Using the same procedures as in Example 1, the image reproducing materials No. 7 and No. 8 were exposed for 1 minute and 30 seconds, immersed in the first developer for 9 seconds, immersed in the second developer for 51 seconds and washed with water. Since the adhesion between the photosensitive resin layer and aluminium layer was poor, no image were reproduced in the 5–80% region of the tone range on the Sample material No. 7 and in the 5–40% region of the tone range on the Sample material No. 8.

What is claimed is:

1. An image reproducing material comprising a supporting sheet bearing a metal or metallic compound layer having a thickness of 100 to 1000 Å and a photosensitive resin layer, which is characterized in that said photosensitive resin layer contains (1) ethylenically unsaturated compound which is polymerizable by the action of free radical and chain propagative, (2) a compound showing photochromism by radical mechanism, (3) free radical producing agent and (4) actinic light absorber.

2. An image reproducing material according to claim 1, wherein the monomer type ethylenically unsaturated compound being polymerizable by the action of free radical and chain propagative is used together with a soluble high molecular binder in the photosensitive resin layer.

3. An image reproducing material according to claim 1 or 2, wherein the minimum value of optical densities of the photosensitive resin layer illuminated by actinic radiations of 350 to 400 nm resides in a range from 1.5 to 3.5.

4. An image reproducing material according to claim 1, wherein the photosensitive resin layer is added with coloring matter.

5. An image reproducing material according to claim 1, wherein an adhesive layer is placed between the metal or metallic compound layer and the photosensitive resin layer.

6. An image reproducing material according to claim 1, wherein a protective layer is formed on said photosensitive resin layer.

7. An image formed or reproduced material obtained by imagewise exposing a metal image reproducing material and processing the same, the image formed or reproduced material comprising a supporting sheet bearing a metal or metallic compound layer having a thickness of 100 to 1000 Å and a photosensitive resin layer containing (1) ethylenically unsaturated compound which is polymerizable by the action of free radical and chain propagative, (2) a compound showing photochromism by radical mechanism, (3) free radical producing agent and (4) an actinic light absorber.

8. In a method for reproducing images on the image reproducing material comprising a supporting sheet bearing a metal or metallic compound layer and a photosensitive resin layer containing (1) ethylenically unsaturated compound which is polymerizable by the action of free radical and chain propagative, (2) a compound showing photochromism by radical mechanism, (3) free radical producing agent, and (4) actinic light absorber, the method characterizing by, after imagewise exposing said image reproducing material, subjecting the photosensitive resin layer to the first development step and thereafter, subjecting the metal or metallic compound layer to the second development step with an aqueous solution containing alkaline earth metal.

9. A method according to claim 8, wherein the exposed photosensitive resin layer is subjected to the first development step with an aqueous solution containing alkali metal.

10. In a method for reproducing metallic images by imagewise exposing a metal image reproducing material comprising a supporting sheet bearing a metal or metallic compound layer and a photosensitive resin layer containing (1) ethylenically unsaturated compound which is polymerizable by the action of free radical and chain propagative, (2) a compound showing photochromism by radical mechanism, (3) free radical producing agent, and (4) actinic light absorber, and processing the same, the method which is characterized in that at least the metal or metallic compound layer is processed with an alkaline aqueous solution containing iron ions and/or copper irons.

11. A method for effecting dot-etching of the imaged material obtained by imagewise exposing an image reproducing material comprising a supporting sheet bearing a metal or metallic compound layer and a photosensitive resin layer containing (1) ethylenically unsaturated compound which is polymerizable by the action of free radical and chain propagative, (2) a compound showing photochromism by radical mechanism, (3) free radical producing agent, and (4) actinic light absorber, and developing the same, comprising subjecting the resin layer to the first dot-etching step and then the metal or metallic compound layer to the second dot-etching with an aqueous solution containing alkaline earth metal.

12. A method for effecting dot-etching of the imaged material obtained by imagewise exposing an image reproducing material comprising a supporting sheet bearing a metal or metallic compound layer and a photosensitive resin layer containing (1) ethylenically unsaturated compound which is polymerizable by the action of free radical and chain propagative, (2) a compound showing photochromism by radical mechanism, (3) free radical producing agent, and (4) actinic light absorber, and developing the same, comprising subjecting at least the metal or metallic compound layer to a dot-etching with an alkaline aqueous solution containing iron ions and/or copper ions.

* * * * *

UNITED STATES PATENT AND TRADEMARK OFFICE
CERTIFICATE OF CORRECTION

PATENT NO. : 4,419,438
DATED : December 6, 1983
INVENTOR(S) : Kuniomi Etoh, et al.

It is certified that error appears in the above-identified patent and that said Letters Patent is hereby corrected as shown below:

On face of patent, (73) Assignee:, Change
"Toyo Boseki Kabushiki Kaisha, Osaka, Japan" to
--Toyo Boseki Kabushiki Kaisha, Osaka and
Toppan Printing Co., Ltd., Tokyo, both of Japan.

Signed and Sealed this

Ninth Day of July 1985

[SEAL]

*Attest:*

DONALD J. QUIGG

*Attesting Officer*   *Acting Commissioner of Patents and Trademarks*